US006500257B1

United States Patent
Wang et al.

(10) Patent No.: US 6,500,257 B1
(45) Date of Patent: Dec. 31, 2002

(54) EPITAXIAL MATERIAL GROWN LATERALLY WITHIN A TRENCH AND METHOD FOR PRODUCING SAME

(75) Inventors: Shih-Yuan Wang, Palo Alto, CA (US); Changhua Chen, San Jose, CA (US); Yong Chen, Mountain View, CA (US); Scott W. Corzine, Sunnyvale, CA (US); R. Scott Kern, San Jose, CA (US); Richard P. Schneider, Jr., Mountain View, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 466 days.

(21) Appl. No.: 09/062,028

(22) Filed: Apr. 17, 1998

(51) Int. Cl.⁷ .............................................. C30B 23/00
(52) U.S. Cl. ........................................ 117/95; 438/479
(58) Field of Search ............................ 117/95; 438/479

(56) References Cited

U.S. PATENT DOCUMENTS

| | | | | |
|---|---|---|---|---|
| 4,053,350 A | * | 10/1977 | Olsen et al. ................ 156/659 |
| 4,522,661 A | * | 6/1985 | Morrison et al. .......... 148/33.2 |
| 5,236,544 A | * | 8/1993 | Yamagata .................... 156/603 |
| 5,356,510 A | * | 10/1994 | Pribat et al. .................. 117/95 |
| 5,494,837 A | | 2/1996 | Subramanian et al. ........ 437/37 |
| 5,591,666 A | | 1/1997 | Shiralagi et al. ............. 437/103 |

FOREIGN PATENT DOCUMENTS

| EP | 0 551 751 A2 | 11/1995 | |
| JP | 62295157 | 12/1987 | ........... H01L/27/10 |

OTHER PUBLICATIONS

Linthicum, K. J. et al., "Process Routed for Low–Defect Density GaN on Various Substrates Employing Pendeo–Epitaxial Growth Techniques", MRS Internet J. Nitride Semicond. Res. 4Si, G4.9(1999).

* cited by examiner

Primary Examiner—Olik Chaudhuri
Assistant Examiner—Douglas A. Wille

(57) ABSTRACT

An epitaxial material grown laterally in a trench allows for the fabrication of a trench-based semiconductor material that is substantially low in dislocation density. Initiating the growth from a sidewall of a trench minimizes the density of dislocations present in the lattice growth template, which minimizes the dislocation density in the regrown material. Also, by allowing the regrowth to fill and overflow the trench, the low dislocation density material can cover the entire surface of the substrate upon which the low dislocation density material is grown. Furthermore, with successive iterations of the trench growth procedure, higher quality material can be obtained. Devices that require a stable, high quality epitaxial material can then be fabricated from the low dislocation density material.

15 Claims, 8 Drawing Sheets

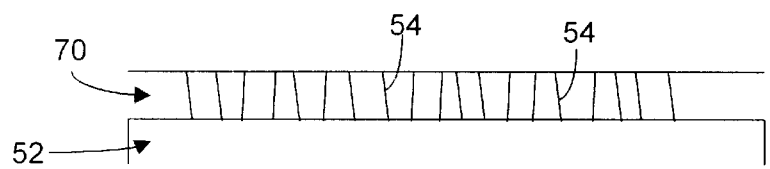
Fig. 3A
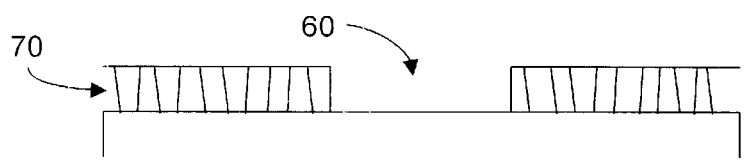
Fig. 3B
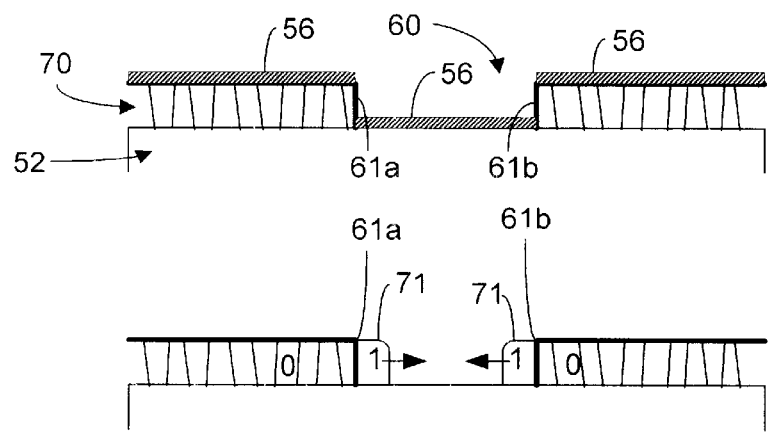
Fig. 3C
Fig. 3D
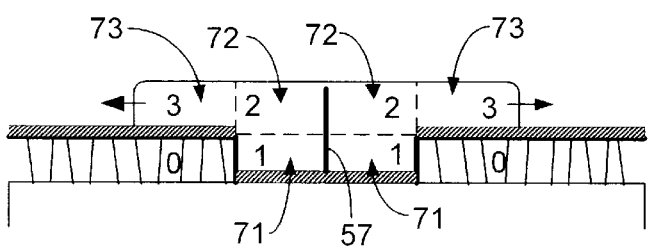
Fig. 3E
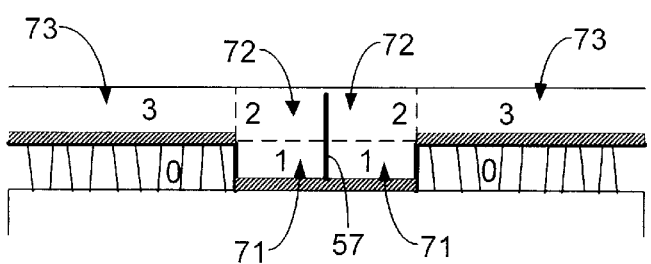
Fig. 3F

EPITAXIAL MATERIAL GROWN LATERALLY WITHIN A TRENCH AND METHOD FOR PRODUCING SAME

FIELD OF THE INVENTION

The present invention relates generally to the fabrication of semiconductor materials, and, more particularly, to a new fabrication configuration having an epitaxial material grown laterally in a trench and a method for producing same.

BACKGROUND OF THE INVENTION

A building block of many electronic devices such as diodes, transistors, and lasers is the p-n junction. The p-n junction, or active region, is typically formed from epitaxial growth material, which is in turn grown on a substrate. The growth material can be referred to as semiconductor material. The semiconductor material is typically fabricated by growing an epitaxial layer of a chosen material upon a substrate material. The substrate material may be, and frequently is, of a different composition than the material used to grow the epitaxial layer.

The epitaxial layer is typically a thin single crystalline film that is deposited upon a crystalline substrate. The epitaxial layer is typically deposited so that the crystal lattice structure of the epitaxial layer closely matches the crystal lattice structure of the substrate. When there is a significant mismatch between the lattice structure of the substrate and the epitaxial layer, a large number of defects, or dislocations, can result. Dislocations manifest in the form of imperfections in the crystal structure and can result in high optical loss, low optical efficiency, non uniform quantum wells in the active region, or the reduction of the electrical quality of the material, thus preventing the material from being used to fabricate certain devices, such as lasers and transistor structures. A largely dislocation-free material is desired for these highly critical devices.

Dislocations are typical when trying to grow an epitaxial layer over a substrate having a different lattice structure. Dislocation densities on the order of $10^7$ to $10^9$ dislocations per square centimeter ($cm^2$) can be common and result in poor semiconductor material that is unusable for certain critical applications.

Dislocation density can be reduced by adding a mask layer over the substrate material prior to growing the epitaxial layer. When the epitaxial layer is then grown over the mask, the epitaxial layer grows laterally, resulting in a reduced dislocation density being present in the portion of the epitaxial layer that resides over the mask. Because the dislocations tend to propagate vertically, the vertically grown material present in the unmasked region of a wafer will be of higher dislocation density as the defects will continue to propagate throughout the layer.

Furthermore, multiple layers of masking material having multiple layers of epitaxial growth may further reduce the dislocation density. While the growing of multiple epitaxial layers over mask layers has some benefit, a drawback is that the mask layer adds cost, complexity, and can add contamination to the epitaxial growth material. Successive iterations may yield low dislocation density material over the entire wafer. It would be desirable to grow the material in a manner in which the low dislocation density material is present over the entire wafer in a single growth sequence.

Thus, an unaddressed need exists in the industry for a simplified method for developing a quantity of high quality, low dislocation density material, which covers the entire surface of a wafer, in an epitaxial layer grown over a lattice mismatched substrate.

SUMMARY OF THE INVENTION

The invention provides an epitaxial material grown laterally in a trench and a method for producing same. Although not limited to these particular applications, the material and method for producing it are particularly suited for fabrication of high quality GaN material system epitaxial layers over a sapphire substrate. The GaN material system can include members of the Group III–V family including, but not limited to, gallium nitride (GaN), indium gallium nitride (InGaN), indium nitride (InN), aluminum gallium nitride (AlGaN), aluminum nitride (AlN), aluminum indium gallium nitride (AlInGaN), gallium arsenide nitride (GaAsN), indium gallium arsenide nitride (InGaAsN), aluminum gallium arsenide nitride (AlGaAsN), gallium phosphide nitride (GaPN), indium gallium phosphide nitride (InGaPN), aluminum gallium phosphide nitride (AlGaPN), etc.

The present invention can be conceptualized as providing a method for growing a low dislocation density material comprising the following steps. First, a trench is formed in a substrate. Alternatively, an epitaxial layer is grown over a substrate and a trench is formed therein. The trench is formed preferably by etching the substrate or the first epitaxial layer. An epitaxial lateral growth layer is then grown in the trench, the growth layer originating from the side walls of the trench. Illustratively the epitaxial lateral growth layer can partially fill, completely fill, or overflow the trench. It is also possible to apply a mask layer, which can be either an insulating layer or a conducting layer, at the bottom of the trench, over the top of the first epitaxial layer, or any combination thereof.

In an alternate embodiment the epitaxial lateral growth layer can be grown from a single wall of the trench laterally across the trench, and eventually filling and overflowing the trench. In addition a device having a p-n junction, or active region, can be grown in the epitaxial lateral growth layer.

In architecture, when employed in connection with the fabrication of a low dislocation density material, the aforementioned method for multiple lateral growth of an epitaxial layer including the forming of a trench in the epitaxial material results in a low dislocation density material as follows.

A low dislocation density material system comprises a substrate, or alternatively, a first epitaxial layer over a substrate. A trench is formed, preferably by etching, in the substrate or the first epitaxial layer. An epitaxial lateral growth layer is then grown in the trench, the growth layer extending from the side walls of the trench. The material can further comprise a mask layer, the mask layer being either insulating material or conducting material and applied to the bottom of the trench, over the first epitaxial layer, or any combination thereof. The mask material is designed to further control and define the growth pattern of the epitaxial lateral growth layer. Furthermore, one side wall of the trench can be coated with the mask layer, and the epitaxial lateral growth layer can then be grown from the opposing side wall of the trench. When grown from a side wall of the trench the epitaxial lateral growth layer can have a p-n junction, or active region, formed therein.

The invention has numerous advantages, a few which are delineated, hereafter, as merely examples.

An advantage of the invention is that it increases the yield of high quality, low dislocation density material in an epitaxial layer grown over a substrate.

Another advantage of the invention is that it reduces the amount of optical loss in the epitaxial layer of a semiconductor material.

Another advantage of the invention is that it increases the optical efficiency in the epitaxial layer of a semiconductor material.

Another advantage of the invention is that it improves the electrical performance of the material forming the epitaxial layer of a semiconductor.

Another advantage of the invention is that contamination arising from the use of a mask can be reduced or eliminated.

Another advantage of the invention is that it is simple in design and easily implemented on a mass scale for commercial production.

Other features and advantages of the invention will become apparent to one with skill in the art upon examination of the following drawings and detailed description. These additional features and advantages are intended to be included herein within the scope of the present invention.

BRIEF DESCRIPTION OF THE DRAWINGS

The present invention, as defined in the claims, can be better understood with reference to the following drawings. The components within the drawings are not necessarily to scale relative to each other, emphasis instead being placed upon dearly illustrating the principles of the present invention.

FIGS. 3A through 3F are cross-sectional schematic views collectively illustrating the growth progression of the low dislocation density material of the present invention;

DETAILED DESCRIPTION OF THE PREFERRED EMBODIMENT

The present invention can be implemented using a variety of substrate and epitaxial growth materials. While applicable to a variety of materials where the defects tend to propagate along a particular growth direction, the preferred embodiment of the low dislocation density method and material is particularly useful for growing a gallium nitride (GaN) material system epitaxial layer over a sapphire substrate. The GaN material system can include members of the Group III–V family including, but not limited to, gallium nitride (GaN), indium gallium nitride (InGaN), indium nitride (InN), aluminum gallium nitride (AlGaN), aluminum nitride (AlN), aluminum gallium nitride (AlGaN), aluminum indium gallium nitride (AlInGaN), gallium arsenide nitride (GaAsN), indium gallium arsenide nitride (InGaAsN), aluminum gallium arsenide nitride (AlGaAsN), gallium phosphide nitride (GaPN), indium gallium phosphide nitride (InGaPN), aluminum gallium phosphide nitride (AlGaPN), etc. The concepts and features of the present invention are applicable to other epitaxial layer materials and substrate materials and those other compounds and materials are contemplated herein.

Figure 1:
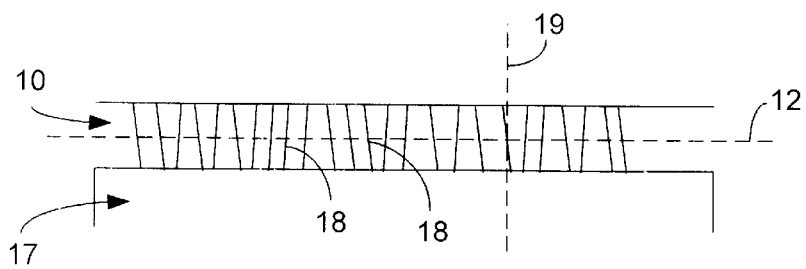
FIG. 1 is a cross-sectional schematic view illustrating dislocations present in an epitaxial growth layer.

Referring now to FIG. 1, shown is a schematic cross-sectional view of a typical GaN epitaxial layer 10 grown on a sapphire substrate 17. The high density of dislocations 18 in the GaN epitaxial layer 10 is a result of a large lattice mismatch between the epitaxial layer 10 and the substrate 17. It is important to note that the dislocations 18 run predominantly vertically through the epitaxial layer along the growth direction. Illustratively, in this example, the growth direction is vertical. For this situation, lattice planes 12 which cut horizontally across the surface expose every dislocation and hence contain the maximum dislocation density per unit area. In contrast, lattice planes 19 running vertically from the substrate up to the surface intersect far fewer dislocations since these lattice planes run substantially parallel to the dislocations and hence, contain the minimum dislocations per unit area of any lattice plane.

Therefore, an exposed vertical, or nearly vertical, sidewall of the original epitaxial layer has a dramatically reduced density of dislocations and hence serves as an excellent surface from which to grow additional GaN material. This concept forms the basis for the invention described herein.

From a more general perspective, if an epitaxial layer contains dislocations which run substantially along a particular direction in the crystal, then regrowing additional epitaxial material in a direction which lies perpendicular to the predominant direction of dislocations can dramatically reduce the density of dislocations in the regrown layer.

Referring back to FIG. 1, the dislocations run predominantly vertically. Thus, any type of regrowth directed along the horizontal or lateral direction should improve the material quality of the regrown layer. In simpler words, rotating the growth direction by 90 degrees (from vertical to lateral in this case) reduces the density of dislocations and produces higher quality material.

Figure 2A:
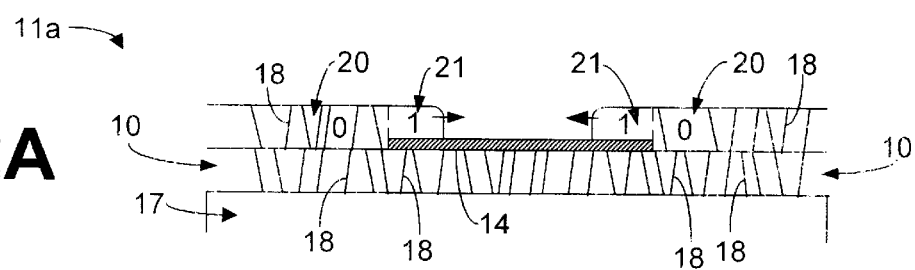
FIGS. 2A and 2B are cross-sectional schematic views collectively illustrating a prior art method of rotating the growth direction of an epitaxial layer to reduce the density of dislocations of FIG. 1.
Figure 2B:
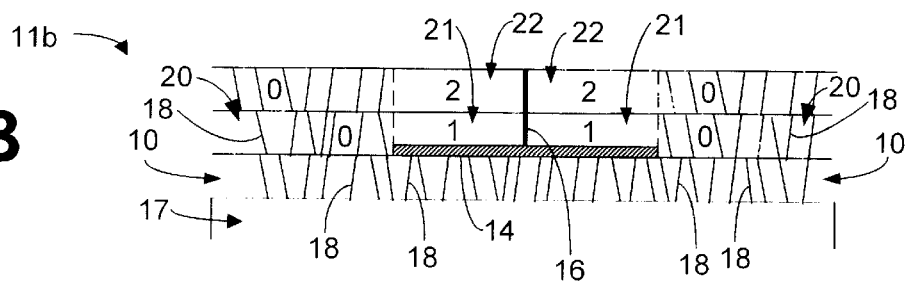

Referring now to FIGS. 2A and 2B, shown is an existing method of rotating the growth direction. By applying stripes of silicon dioxide ($SiO_2$) 14 on the surface of the first GaN epitaxial layer 10, the GaN 20 which grows up from the unmasked areas around the $SiO_2$ stripes is forced to grow laterally in order to cover the $SiO_2$. This laterally grown layer 21 therefore accomplishes the desired 90 degree growth rotation and as a result has fewer dislocations than the original layer 10. Additional growth will force the growth direction vertical again above layer 21 forming epitaxial layer 22.

The final surface of the wafer will therefore be covered with a mixture of epitaxial layers 22, which have gone through two (2) growth rotations and hence should be of high quality (low dislocation density), and epitaxial layers 20 which have grown up vertically from the substrate and have gone through zero (0) growth rotations. Epitaxial layers 20 propagate the original dislocations, and hence are of low quality (high dislocation density). Illustratively, the number of growth rotations occurring before a given layer is regrown is indicated for each layer in FIG. 2 and the figures hereinafter. It should also be pointed out that where the growth fronts of layers 21 meet in the center of the $SiO_2$ stripe 14, a dislocation 16, or possibly a void, is formed. A void can be an area below the dislocation formed where the growth fronts do not completely meet.

Some of the disadvantages of the existing method for rotating the growth direction are that portions of the final surface still contain low quality, high dislocation density material 20. The dislocation and/or void 16 in the center of the $SiO_2$ stripe may also be undesirable. Finally, the $SiO_2$ mask itself is a source of oxygen contamination in the epitaxial growth process and can degrade the quality of the regrown layers.

Now referring to FIGS. 3A through 3F, shown are schematic views illustrating the growth progression of the low dislocation density material of the present invention. Briefly stated, the present invention allows for the growth of high quality, low dislocation density epitaxial material across the entire surface of a wafer in a single regrowth step. This is accomplished by initiating the growth on the sidewalls of a trench or array of trenches formed in a GaN epitaxial layer or substrate material. Additionally, maskless regrowth under certain growth conditions (those which favor lateral growth over vertical growth) is possible with the present invention, which eliminates the possibility of growth contamination originating from a mask layer.

Referring to FIG. 3A, a first epitaxial layer 70 is grown on sapphire substrate layer 52. Layer 52 however can be other substrate material as known in the art, including but not limited to, silicon (Si), gallium arsenide (GaAs), silicon carbide (SiC), or indium phosphide (InP). While illustratively GaN in the preferred embodiment, first epitaxial layer 70 may be various other materials including, but not limited to, any of the GaN material system. The GaN material system can include members of the Group III–V family including, but not limited to, gallium nitride (GaN), indium gallium nitride (InGaN), indium nitride (InN), aluminum Gallium nitride (AlGaN), aluminum nitride (AlN), aluminum gallium nitride (AlGaN), aluminum indium gallium nitride (AlInGaN), gallium arsenide nitride (GaAsN), indium gallium arsenide nitride (InGaAsN), aluminum gallium arsenide nitride (AlGaAsN), gallium phosphide nitride (GaPN), indium gallium phosphide nitride (InGaPN), aluminum gallium phosphide nitride (AlGaPN), etc. Also shown in first epitaxial layer 70 are dislocations 54. Dislocations 54 are defects in the first epitaxial layer, and are similar to dislocations 18 as described with respect to FIG. 1.

Referring now to FIG. 3B, trench 60 can be formed, preferably by etching, in first epitaxial layer 70. Trench 60 is depicted as extending down to substrate 52, however trench 60 need not extend completely to substrate 52. Trench 60 has substantially vertical sidewalls 61a and 61b. However, it is important to note that while trench 60 is shown in the preferred embodiment having substantially vertical sidewalls, it is possible for trench 60 to have sloped side walls as well.

Referring now to FIG. 3D, epitaxial lateral growth 71, which originates from the sidewalls 61a and 61b of trench 60 will be of much higher quality than the original layer 70 because the lateral growth is starting from a lattice template or plane which cuts through the fewest possible dislocations of the original epitaxial layer 70. In other words, since regrown layer 71 has gone through one (1) growth rotation, it should be of higher quality with fewer dislocations than the original layer 70.

Referring now to FIG. 3C, growth on the horizontal lattice planes of the trench structure can be suppressed if necessary using optional mask layer 56 as illustrated. Mask layer 56 could be, depending upon the material characteristics desired, either an insulator like $SiO_2$ or a conducting material like tungsten. Mask layer 56 can cover the horizontal surfaces of substrate 52, or first epitaxial layer 70, or any combination thereof so that the vertical growth of the epitaxial lateral growth layer 71 can be further suppressed. However, if the growth conditions are such that the lateral growth rate is much faster than the vertical growth rate, mask 56 may not be necessary at all. The omission of a mask for the regrowth step is desirable for minimizing contamination in the growth process and hence is an important potential benefit of the present invention.

Referring now to FIG. 3E, when the growth fronts of epitaxial lateral growth layer 71, emanating from sidewalls 61a and 61b, meet in the center of trench 60, a dislocation 57, or possibly a void, is formed. From this point, the material comprising epitaxial lateral growth layer 71 proceeds to grow vertically again, representing another growth rotation. Epitaxial layer 72 therefore has gone through two (2) growth rotations as indicated in FIG. 3E. Finally, another growth rotation occurs as layer 73 is grown laterally out from layer 72, spilling out on top of first epitaxial layer 70. The final surface of the wafer will therefore eventually be covered with a mixture of epitaxial layers 73 and 72 which have both gone through at least two (2) growth rotations, and hence should both be of significantly higher quality than first epitaxial layer 70.

In comparison to the existing method illustrated in FIGS. 2A and 2B, the present invention, using the same number of regrowth steps, provides not only complete wafer coverage with high quality material, but also produces some surface layers which have gone through more growth rotations and hence are potentially higher in quality than layers created with the existing method of FIGS. 2A and 2B.

It should be noted that the above description of growth inside and over a trench is illustrative in that the layer growth does not necessarily proceed in such an orderly time sequence from layer 71 to 72 to 73, etc. For example, layer 72 will start growing before the growth fronts of layer 71 meet each other. Furthermore, the boundaries between layers having different numbers of growth rotations are not as well-defined or as rectangular as indicated in FIGS. 3D, 3E and 3F.

However, the above simplified description serves to illustrate the basic growth sequence and how the material quality potentially improves as it grows out of the trench and goes through a complete 180 degree change in growth direction, eventually covering the entire surface of the wafer, or substrate.

Figure 4A:
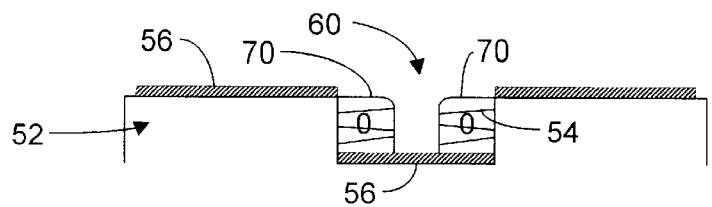
FIGS. 4A through 4C are cross-sectional schematic views collectively illustrating the growth of the low dislocation density material of FIGS. 3A through 3F, whereby the substrate material of FIGS. 3A through 3F has a trench formed therein.

Referring now to FIG. 4A, shown is the substrate material of FIGS. 3A through 3F having a trench 60 formed therein.

Substrate 52 has trench 60 formed therein similarly to that described with respect to FIG. 3C. Optional mask layer 56 can be applied to the base of trench 60, to the horizontal surfaces of substrate 52, or to a combination thereof such that vertical growth can be further suppressed. The lateral growth of first epitaxial layer 70 from the sidewalls in this example produces GaN much like the quality shown in FIG. 1.

Figure 4B:
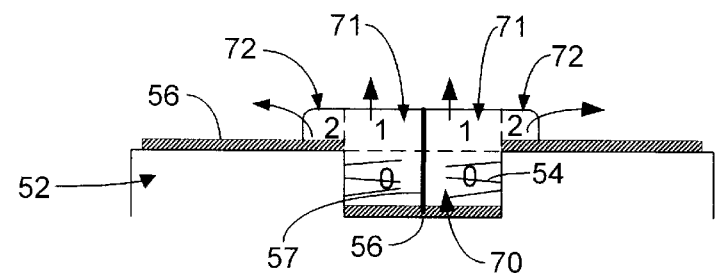

However, as illustrated in FIG. 4B, when the two growth fronts meet in the center forming dislocation 57, the growth will proceed vertically and many dislocations 54 will be trapped laterally within trench 60. Epitaxial lateral growth layer 71 will therefore have gone through one (1) growth rotation. The epitaxial lateral growth layer 72 spilling out over the masked substrate 52 will go through an additional change in growth direction, resulting in two (2) growth rotations. The result, as shown in FIG. 4B, is a surface covered with high quality epitaxial layers 72 and 71 that have gone through two (2) and one (1) growth rotations, respectively. While this embodiment has one fewer number of growth rotations than that shown in FIG. 3F, it does not require any regrowths and hence is simpler and more cost-effective.

Figure 4C:
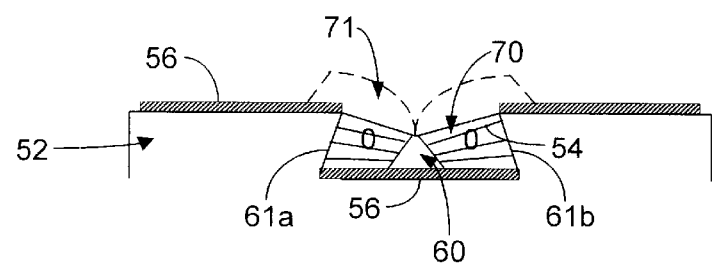

With reference now to FIG. 4C, it should also be noted that the trenches in FIGS. 4A through 4C do not necessarily require vertical sidewalls. For example, FIG. 4C illustrates that if, for example, a cubic zinc-blende structure such as silicon is used as the substrate 52, a trench 60 having non-vertical sidewalls 61a and 61b can be etched in substrate 52. The non-vertical sidewalls 61a and 61b will direct the dislocations 54 downward trapping them more effectively in the trench 60, while the vertical growth 71 proceeds largely free of the original dislocations generated in layer 70.

Figure 5:
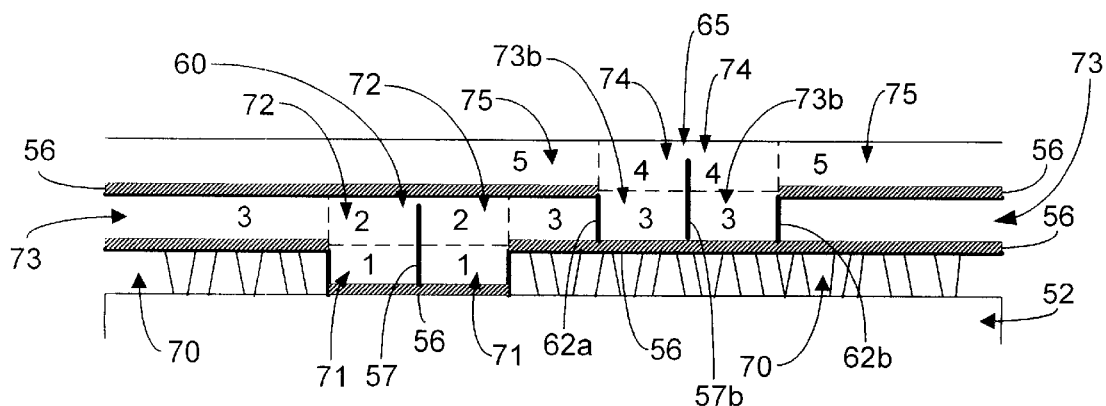
FIG. 5 is a cross-sectional schematic view illustrating multiple lateral growth layers of the low dislocation density material of FIGS. 3A through 3F.

Referring now to FIG. 5, shown are multiple lateral growth layers of the low dislocation density material of FIGS. 3A through 3F. FIG. 5 illustrates that the trench growth procedure can be used iteratively to potentially further improve the material quality. After growing layers out of trench 60 resulting in the material of FIG. 3F with layers 72 and 73 covering first epitaxial layer 70, an additional trench 65 could be formed in layer 73 and mask 56, if desired, can be redeposited. The 180 degree change in growth direction again wraps around optional mask layer 56 on the surface of layer 73 and produces layer 73b growing laterally inward from the sidewalls 62a and 62b of additional trench 65 of layer 73. In this arrangement, layer 74 then grows vertically over layer 73b, and layer 75 grows laterally outward again from layer 74. The upper layers 75 and 74, which cover the surface, have gone through five (5) and four (4) growth rotations respectively, again with a dislocation 57b at the center of the trench. Thus, two additional growth rotations are possible with each iteration.

Figure 6A:
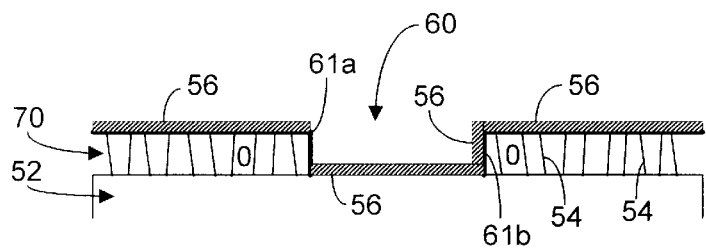
FIGS. 6A through 6E are cross-sectional schematic views collectively illustrating an alternate embodiment of the growth of the low dislocation density material of FIGS. 3A through 3F.
Figure 6B:
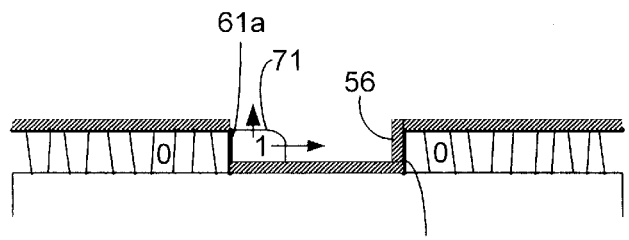

With reference now to FIGS. 6A through 6E, shown are schematic views illustrating an alternate embodiment of the growth of the low dislocation density material of FIGS. 3A through 3F. It is possible to eliminate dislocation 57 by growing epitaxial lateral growth material from only one sidewall, 61a for example, of trench 60. Either sidewall 61a or 61b may be used to originate the epitaxial lateral growth layer, sidewall 61a being used in this preferred embodiment for illustration. This is accomplished by masking opposing sidewall 61b as shown in FIG. 6B. Epitaxial lateral growth 71 is initiated from sidewall 61a and growth proceeds across trench 60, in this case filling and then spilling out over the top of the trench 60. As described above with respect to FIGS. 3A through 3F, layers 71–73 are produced covering the entire surface of the substrate, or wafer, with high quality, low dislocation density epitaxial material; however, dislocation 57 is eliminated.

Figure 6C:
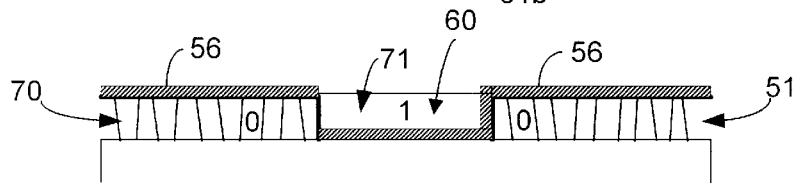

Referring now to FIG. 6C, shown is epitaxial lateral growth layer 71 completely filing trench 60. While shown as growing laterally, epitaxial lateral growth layer 71 has both a lateral growth rate and a vertical growth rate, however, for simplicity, is shown as primarily growing laterally.

Figure 6D:
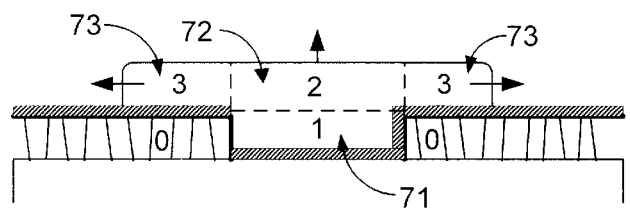
Figure 6E:
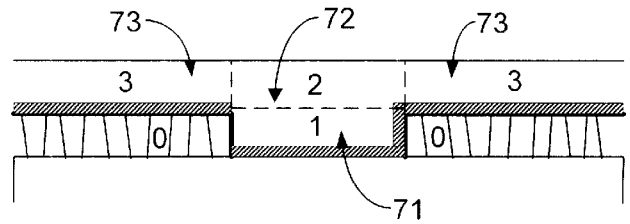

Referring now to FIG. 6D, shown is epitaxial lateral growth layer 72 growing out of trench 60 and over first epitaxial lateral growth layer 71. Finally, FIG. 6E shows an epitaxial lateral growth layer 73 growing laterally and forming a very low dislocation material of epitaxial growth.

Figure 7:
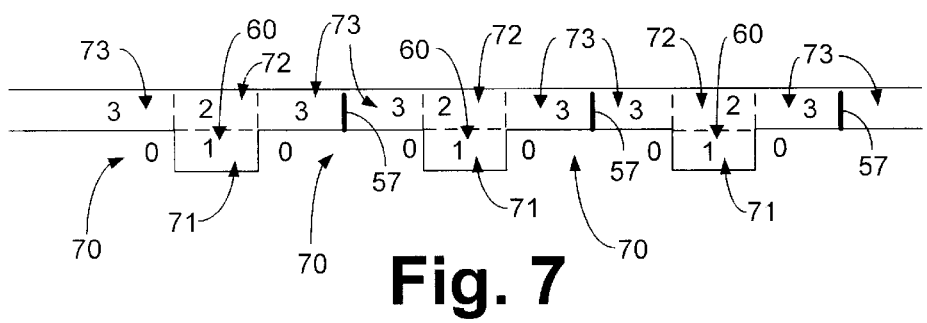
FIG. 7 is a cross-sectional schematic view illustrating an array of the trenches of FIGS. 3A–3F, 4A–4C, 5 and 6A–6E covering an entire substrate.

With reference now to FIG. 7, shown is an array of the trenches of FIGS. 3A–3F, FIGS. 4A–4C, FIG. 5, and FIGS. 6A–6E covering an entire substrate, or wafer. It is possible to cover an entire wafer with the low dislocation density material described herein by forming arrays of trenches as shown in FIG. 7. This extension to the single trench concept can be applied to all methods and materials discussed above. For example, the single sidewall trench method and material illustrated in FIGS. 6A through 6E can be extended to arrays of trenches 60 as shown in FIG. 7. In this arrangement epitaxial lateral growth layers 73 meet each other between trenches 60 and form dislocations 57. For the double sidewall growth as described with respect to FIGS. 3A through 3F, an additional dislocation 57 would appear in the center of each trench as well. While dislocation regions 57 still exist where the growth fronts of many epitaxial lateral growth layers meet, a large amount of low dislocation density material is generated.

Figure 8A:
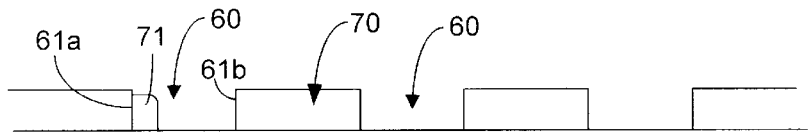
FIGS. 8A and 8B are cross-sectional schematic views collectively illustrating the trenches and mesas that are used to generate the low dislocation density material of FIGS. 3A–3F, 4A–4C, 5 and 6A–6E.
Figure 8B:
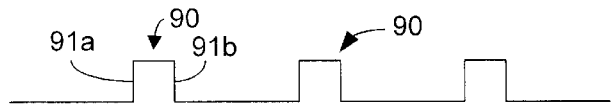

Referring now to FIGS. 8A and 8B, shown are trenches 60 and mesas 90 that can be etched or formed in an epitaxial layer and used to develop the low dislocation density material of FIGS. 3A–3F, FIGS. 4A–4C, FIG. 5, and FIGS. 6A–6E. Mesas 90 are equally valid structures for initiating sidewall growth on sidewalls 91a and 91b. In this arrangement it may be useful to minimize horizontal section 90 to obtain as much lateral growth as possible between mesas, in effect using the mesas as thin vertical seeds for lateral growth.

Figure 9A:
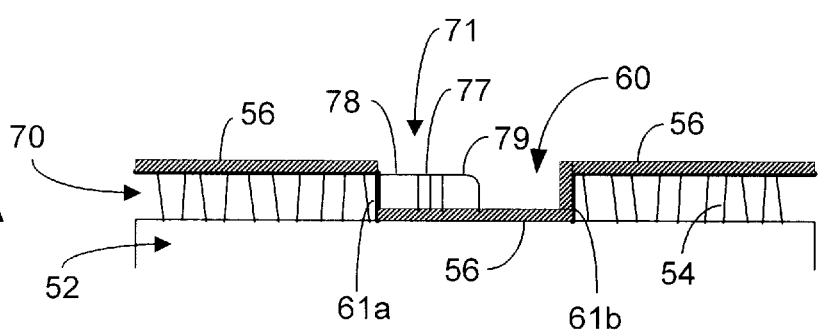
FIGS. 9A and 9B are cross-sectional schematic views collectively illustrating an active region formed in the low dislocation density material of FIGS. 3A–3F and 6A–6E.
Figure 9B:
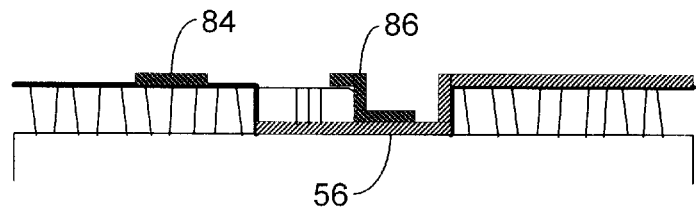

With reference now to FIGS. 9A and 9B, shown are schematic views illustrating an active region formed in the low dislocation density material of FIGS. 3A–3F and FIGS. 6A–6E. In the above discussions, we have concentrated on how to get high quality bulk GaN that covers the entire surface of a wafer. However, it is possible to take advantage of the high quality lateral sidewall growth by growing active regions which, for example, may include p-n junctions for light emitters, quantum wells, or even transistor structures directly on the sidewalls. Growing active regions in this manner results in devices capable of improved performance.

Upon substrate 52, which is illustratively sapphire, is grown first epitaxial layer 70. Trench 60 is formed into first epitaxial layer 70 similarly to that described with respect to FIGS. 3A–3F and 6A–6E. Optional mask layer 56, which can be either a conducting material or insulating material can be applied to the base of trench 60. Optional mask layer 56 can also be applied to the top horizontal surfaces of first epitaxial layer 70, and to wall 6 lb of trench 60. Illustratively, for this embodiment, first epitaxial layer 70 can be of an n-type material. First epitaxial layer 70 can illustratively be either n-type or p-type material depending upon the characteristics of the device being fabricated.

Illustratively, in order to fabricate a high quality optical device, epitaxial lateral growth layer 71 is grown from side wall 61a using n-type material 78. Epitaxial lateral growth layer 71 begins with n-type material section 78 and is followed by active region 77, which is followed by p-type material 79. In this embodiment epitaxial lateral growth layer 71 comprises a device having a p-n junction. Active region 77 can be for example, but not limited to a quantum well active region of indium gallium nitride (InGaN) in a p-n junction for an optical device such as a light emitting diode (LED) or laser; or it can be a transistor.

Referring now to FIG. 9B, shown is epitaxial lateral growth layer 71 having p-ohmic contact material 86 applied thereto. Similarly, if applied, mask layer 56 is removed from first epitaxial layer 70 so that n-ohmic contact material 84 can be applied directly thereto. The foregoing illustrates a p-n junction having electrical contacts 84 and 86 applied thereto, thus illustrating the formation of a high quality optical device using the concepts and features of the low dislocation density method and material of the present invention.

Throughout the above discussion, and in FIGS. 3A–3F, FIGS. 4A–4C, FIG. 5, FIGS. 6A–6E and FIG. 7, the number of growth rotations which have occurred to produce each layer has been emphasized and carefully noted. The reason is that for certain modes of dislocation propagation, successive growth rotations can successively reduce the dislocation density.

Figure 10:
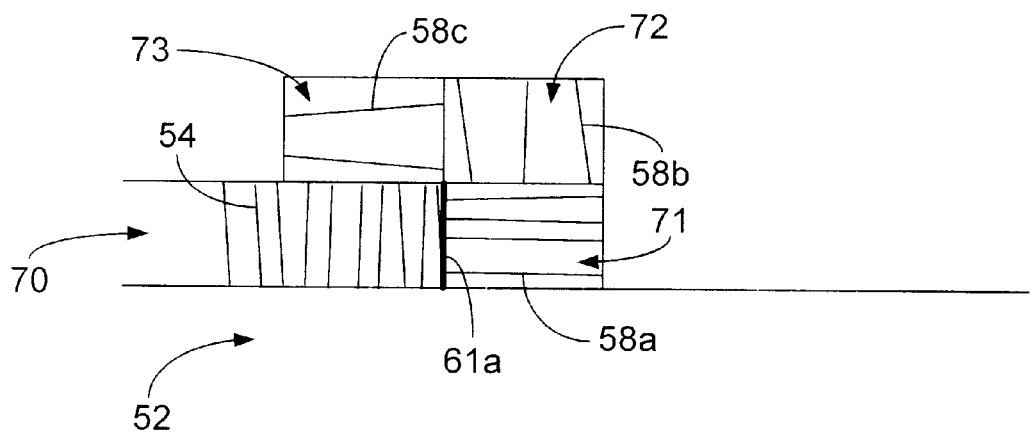
FIG. 10 is a cross-sectional schematic view of the low dislocation density material of FIGS. 3A–3F, 4A–4C, 5 and 6A–6E.

To illustrate, referring now to FIG. 10, shown is a schematic detail view of the low dislocation density material of FIGS. 3A–3F, FIGS. 4A–4C, FIG. 5, and FIGS. 6A–6E. Layer 71, which grows laterally out from the sidewall 61a, may not be entirely dislocation-free. Some of the vertical dislocations 54 in layer 70, which intersect the sidewall growth plane will turn sideways and continue to propagate into layer 71, illustrated as dislocations 58a.

However, the density of dislocations 58a should be substantially lower than those present in layer 70. By changing the growth direction back to the vertical direction, a plane is cut across substantially parallel to the dislocations 58a in layer 71, which implies that the lattice template for growth of layer 72 should contain only a small fraction of the lateral dislocations 58a in layer 71. The result is that even fewer dislocations 58b will propagate vertically into layer 72.

Similarly, for layer 73, the density of dislocations 58c propagating laterally in layer 73 should be much lower than those propagating vertically in layer 72. In this way, successive growth rotations can successively reduce the dislocation density, enabling the iterative procedure illustrated with respect to FIG. 5 the potential for producing very high quality material.

Figure 11A:
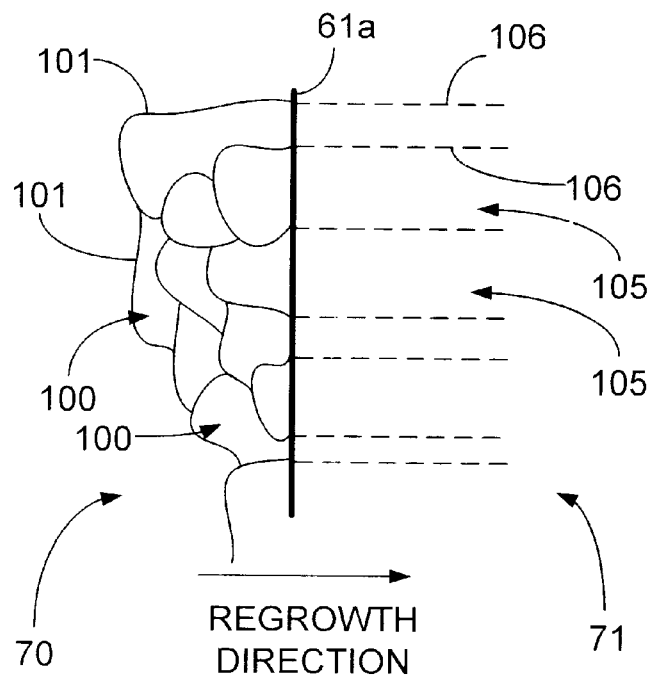
FIGS. 11A through 11C are schematic views collectively illustrating an alternative embodiment of the additional trench of FIG. 5.
Figure 11B:
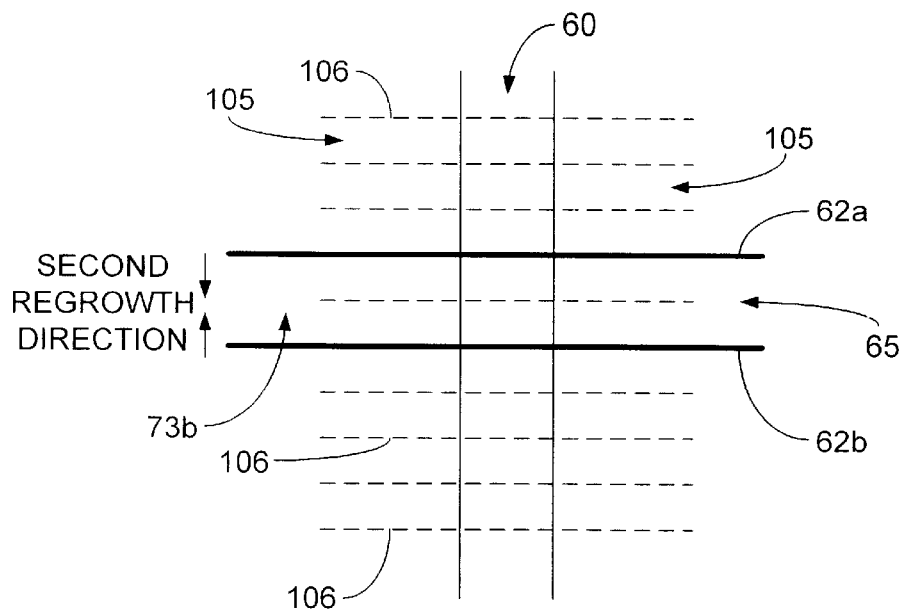
Figure 11C:
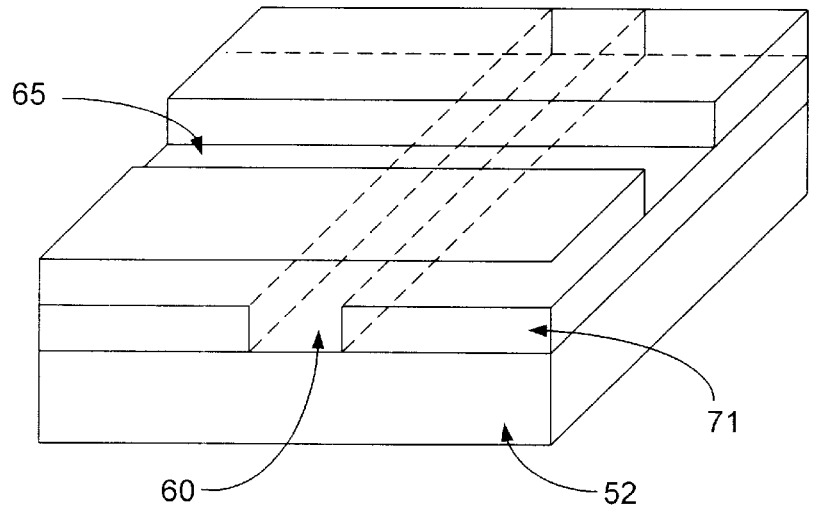

Referring now to FIGS. 11A–11C, shown is an alternative embodiment of the additional trench of FIG. 5. Referring to FIGS. 10 and 11A, shown, from a top view, is an additional mode of dislocation propagation which may not benefit from the dislocation density reduction procedure described with reference to FIG. 10.

When viewed from above, first epitaxial layer 70 is actually comprised of columns of single crystal domains 100 in which boundary surfaces 101 separating the domains contain vertical threads of edge dislocations 54. When a vertical side wall 61a is exposed, these boundary surfaces terminate along the interface formed by substantially vertical sidewall 61a. Regrowing on the sidewall will then propagate these planes 106 containing threads of vertical dislocations 54 in the growth direction to form layer 71.

The resulting layer 71 comprises slabs of single crystal domains 105 separated by boundary planes 106 substantially parallel to each other containing vertical edge dislocations 54. For this case, regrowing vertically and back over first epitaxial layer 70 will propagate the vertical threads up and back over first epitaxial layer 70. Thus, while there is a substantial improvement in growing layer 71 laterally out from the side wall 61a, there is little or no improvement in growing up from layer 71 to form layer 72 and back over layer 70 to form layer 73.

Thus, for this mode of dislocation propagation, successive lateral-verticallateral regrowth rotations do not reduce the dislocation density beyond what the first lateral growth layer 71 achieves.

With reference now to FIG. 11B, the procedure discussed with respect to FIG. 5 can be modified to create a procedure effective at successively reducing the dislocation density in situations where the mode of dislocation propagation follows that described with respect to FIG. 11A.

After first trench 60 and overgrowth are performed, an additional trench 65 is formed at an angle, preferably 90 degrees, to first trench 60. The perspective view in FIG. 11C helps to visualize the procedure. As a result, side walls 62a and 62b now run substantially parallel to the planes of edge dislocations 106, and hence intersect far fewer planes 106 than if the additional trench 65 were formed parallel to first trench 60. This should have the effect of substantially increasing the single crystal domain size in the second regrown layer 73b and hence reducing the dislocation density.

Successive iterations of lateral-lateral-lateral growth rotation by alternating the trench direction by, in this embodiment, 90 degrees should successively reduce the dislocation density in this mode of dislocation propagation. An active region could then be placed on any one of the side wall regrowths or over the whole surface after the growth planarizes.

It will be obvious to those skilled in the art that many modifications and variations may be made to the preferred embodiments of the present invention, as set forth above, without departing substantially from the principles of the present invention. For example, the method and material for lateral growth including a trench in the material can be used to fabricate densely packed silicon transistors. All such modifications and variations are intended to be included herein within the scope of the present invention, as defined in the claims that follow.

What is claimed is:

1. A method for growing a low dislocation density material, comprising the steps of:
    forming a trench in a substrate; and
    growing, in said trench, an epitaxial lateral growth layer, that originates from a wall of said trench, said epitaxial lateral growth layer including a plurality of growth regions, each growth region extending about 90 degrees with respect to each prior growth region, said plurality of growth regions being grown in one continuous growth step.

2. The method as defined in claim 1, wherein said substrate includes a first epitaxial layer.

3. The method as defined in claim 1, wherein said epitaxial lateral growth layer partially fills said trench.

4. The method as defined in claim 1, wherein said epitaxial lateral growth layer completely fills said trench.

5. The method as defined in claim 1, wherein said epitaxial lateral growth layer completely fills and overflows said trench.

6. The method as defined in claim 1, further comprising the step of applying an insulating layer over a base of said trench.

7. The method as defined in claim 1, further comprising the step of applying an insulating layer over said substrate.

8. The method as defined in claim 1, further comprising the step of applying a conducting layer over a base of said trench.

9. The method as defined in claim 1, further comprising the step of applying a conducting layer over said substrate.

10. The method as defined in claim 1, wherein said epitaxial lateral growth layer is grown from a single side of said trench.

11. The method as defined in claim 1, wherein said epitaxial lateral growth layer includes an active region.

12. The method as defined in claim 1, wherein said epitaxial lateral growth layer is a gallium nitride material.

13. The method as defined in claim 1, further including the steps of:

forming an additional trench in said epitaxial lateral growth layer; and growing an additional epitaxial lateral growth layer in said additional trench.

14. The method as defined in claim 1, wherein said trench is etched into said substrate.

15. The method as defined in claim 13, wherein said additional trench is formed at an angle to said trench.

\* \* \* \* \*